(12) United States Patent
An (10) Patent No.: US 7,388,799 B2
(45) Date of Patent: Jun. 17, 2008

(54) SEMICONDUCTOR MEMORY DEVICE

(75) Inventor: Yong-Bok An, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 315 days.

(21) Appl. No.: 11/320,851

(22) Filed: Dec. 30, 2005

(65) Prior Publication Data

US 2007/0002656 A1 Jan. 4, 2007

(30) Foreign Application Priority Data

Jun. 30, 2005 (KR) .................. 10-2005-0058717

(51) Int. Cl.
*G11C 7/00* (2006.01)
(52) U.S. Cl. .................. 365/222; 365/228; 365/185.09; 365/185.25; 365/239
(58) Field of Classification Search ................ 365/222, 365/228, 185.09, 185.25, 239
See application file for complete search history.

(56) References Cited

U.S. PATENT DOCUMENTS

| 5,311,476 | A | | 5/1994 | Kajimoto et al. |
| 5,321,661 | A | * | 6/1994 | Iwakiri et al. ............. 365/222 |
| 6,118,710 | A | | 9/2000 | Tsuji |
| 6,590,815 | B2 | | 7/2003 | Mine |
| 6,731,560 | B2 | | 5/2004 | Kang et al. |
| 2003/0202413 | A1 | | 10/2003 | Komura et al. |
| 2005/0243627 | A1 | * | 11/2005 | Lee et al. ............. 365/222 |

FOREIGN PATENT DOCUMENTS

| JP | 11-353893 A | 12/1999 |
| JP | 2003-297092 A | 10/2003 |
| KR | 2003-0055747 | 7/2003 |
| TW | 512342 | 12/2002 |
| WO | WO 2005/024844 A1 | 3/2005 |

OTHER PUBLICATIONS

Taiwanese Office Action (with English Translation) issued in Taiwanese Patent Application No. TW 094147412, dated Jan. 8, 2008.

* cited by examiner

*Primary Examiner*—Richard T. Elms
*Assistant Examiner*—Eric Wendler
(74) *Attorney, Agent, or Firm*—McDermott Will & Emery LLP (57) ABSTRACT

A semiconductor memory device for consuming a uniform amount of current includes a memory cell block including a N normal wordline and a M preliminary wordline; a refresh address counting block for outputting a refresh address, having a plurality of bits, corresponding to the N normal wordline and the M preliminary wordline; a refresh counting control block for resetting the refresh address counting block when the refresh address counts a predetermined count during a test mode; and a row decoding block for refreshing unit cells coupled to the N normal wordline and unit cells coupled to the M preliminary wordline of the memory cell block according to the refresh address and a redundancy control signal outputted from the refresh counting control block, wherein M, N are positive integers.

20 Claims, 8 Drawing Sheets

SEMICONDUCTOR MEMORY DEVICE

FIELD OF THE INVENTION

The present invention relates to a semiconductor memory device; and, more particularly, to a semiconductor memory device for performing an efficient refresh operation.

DESCRIPTION OF RELATED ART

Generally, a dynamic random access memory DRAM has been used as a semiconductor memory device. The DRAM includes a unit cell constituting a capacitor and a transistor for storing a single-bit data. The single-bit data is stored in the capacitor in a form of electrical charge. However, charge quantity stored in the capacitor is reduced as time passes. Therefore, unit cells included in the DRAM must be refreshed periodically in order to hold the data contents.

Namely, the DRAM performs a refresh operation at every predetermined interval for re-charging the electrical charge in the capacitor of all unit cells during a data access.

For performing the refresh operation, a refresh address indicating where the refresh operation is required and a refresh command for controlling the refresh operation are required.

In a conventional semiconductor memory device, both of the refresh command and the refresh address for the refresh operation are inputted from an external of the semiconductor memory device. Recently, the refresh address for the refresh operation is not inputted from the external of the semiconductor memory device, but generated from internal of the semiconductor memory device by using an internal counter.

An auto-refresh is a refresh operation in response to the refresh address generated from the internal of the semiconductor memory device for the refresh operation, and a self-refresh is a refresh operation in response to the refresh command generated from the internal of the semiconductor memory device even at a power down mode.

In the mean time, after fabricating the semiconductor memory device, a test for finding out defects in the semiconductor memory device is performed. When the defects are found in the semiconductor memory device, a repair process is performed so that a preliminary cell in a redundancy block may perform a normal operation instead of a defective cell in a normal block if the defective cell in the normal block is out of order. The preliminary cell for repairing is fabricated as much as a predetermined quantity of the unit cells during a fabricating process.

Therefore, the redundancy block having the preliminary cell can perform the refresh operation together with the normal block having the defective cell.

Figure 1:
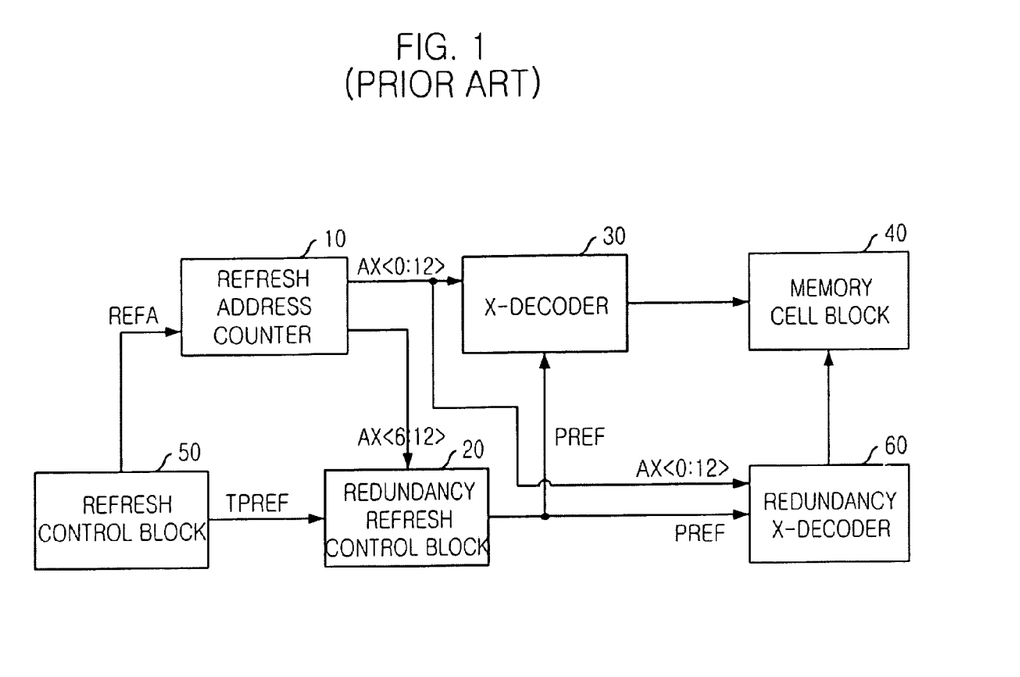
FIG. 1 is a block diagram showing a conventional semiconductor memory device.

FIG. 1 is a block diagram showing a conventional semiconductor memory device.

As shown, the conventional semiconductor memory device includes a refresh address counter 10, a redundancy refresh control block 20, an X-decoder 30, a memory cell block 40, a refresh control block 50 and an Redundancy X-decoder 60.

The memory cell block 40 includes a plurality of unit cells. The refresh control block 50 controls a refresh operation. The refresh address counter 10 counts and outputs an refresh address for the refresh operation in response to a refresh signal REFA outputted from the refresh control block 50. The X-decoder 30 is for refreshing a normal block of the memory cell block 40 in response to a full refresh address signal AX<0:12> from the refresh address counter 10. The Redundancy X-decoder 60 is for refreshing a redundancy block of the memory cell block 40 in response to the full refresh address signal AX<0:12> from the refresh address counter 10. The redundancy refresh control block 20 controls the X-decoder 30 and the Redundancy X-decoder 60, based on a redundancy refresh signal TPREF from the refresh control block 50 and a half refresh address signal AX<6:12> from the refresh address counter 10, so that the normal block and the redundancy block of the memory cell block 40 are not performed sequentially. Hereinafter, a normal cell is located at the normal block of the memory cell block 40 and a preliminary cell is located at the redundancy block of the memory cell block 40.

Figure 2:
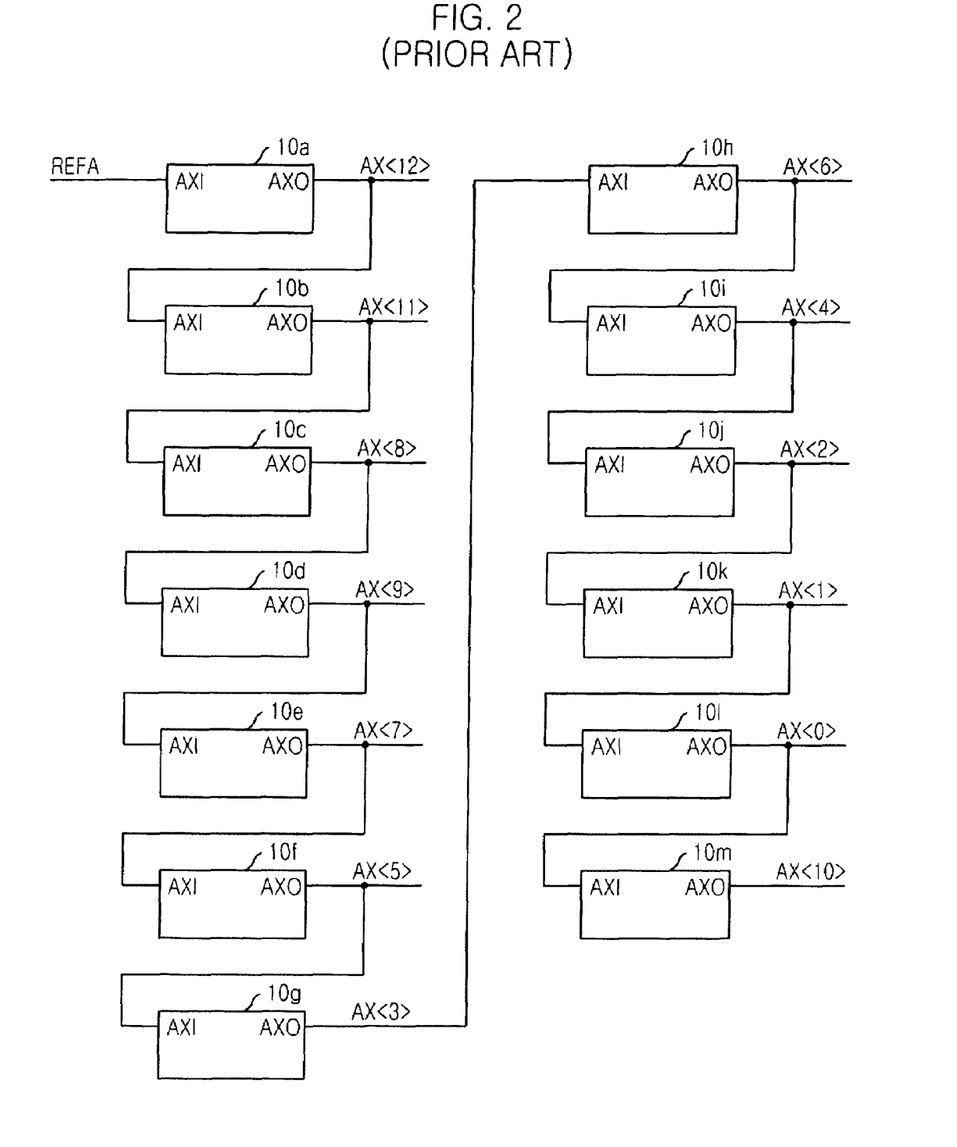
FIG. 2 is a block diagram describing a refresh address counter shown in FIG. 1.

FIG. 2 is a block diagram describing the refresh address counter 10 shown in FIG. 1.

Referring to FIG. 2, the refresh address counter 10 includes a plurality of unit counters 10a to 10m connected in series.

The unit counters 10a to 10m connected in series sequentially count in response to the refresh signal REFA, which is inputted to a first unit counter 10a, to thereby output the full refresh address signal AX<0:12>.

Figure 3:
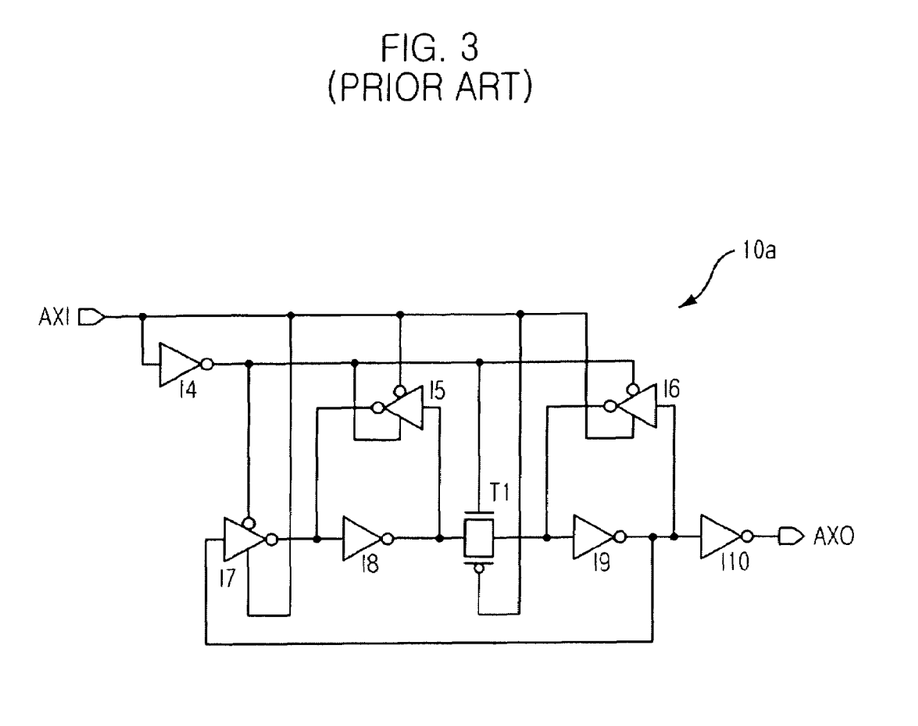
FIG. 3 is a circuit diagram depicting a unit counter shown in FIG. 2.

FIG. 3 is a circuit diagram depicting the unit counters 10a to 10m shown in FIG. 2.

As shown, the first unit counter 10a includes a first latch I5, a second latch I6, a third latch I7, a first inverter I4, a second inverter I8, a third inverter I9, a fourth inverter I10 and a switch T1. The first to fourth inverters I4, I8, I9 and I10 form a closed-loop.

Herein, an operation of the first unit counter 10a is described in detail. First, if a 'LOW' signal is inputted to an input node AXI, the second latch I6 and the third latch I7 turn off. At the same time, the first latch I5 and the switch T1 turn on. So, the same signal as a previous signal is outputted to an output node AXO. If the previous signal is a 'LOW', an input node of the third latch I7 becomes a 'HIGH' by the closed-loop.

Then, if a 'HIGH' signal is inputted to the input node AXI, the second latch I6 and the third latch I7 turn on. At the same time, the first latch I5 and the switch T1 turn off. So, the 'HIGH' signal at the input node of the third latch I7 is transferred and inverted into a 'LOW' signal by the fourth inverter I10. Accordingly, an output signal of the fourth inverter I10 is outputted to the output node AXO.

As described above, whenever the 'LOW' input signal inputted to the input node AXI is converted into the 'HIGH' signal, the unit counts can invert the signal inputted from the input node AXI to thereby output to the output node AXO.

Figure 4:
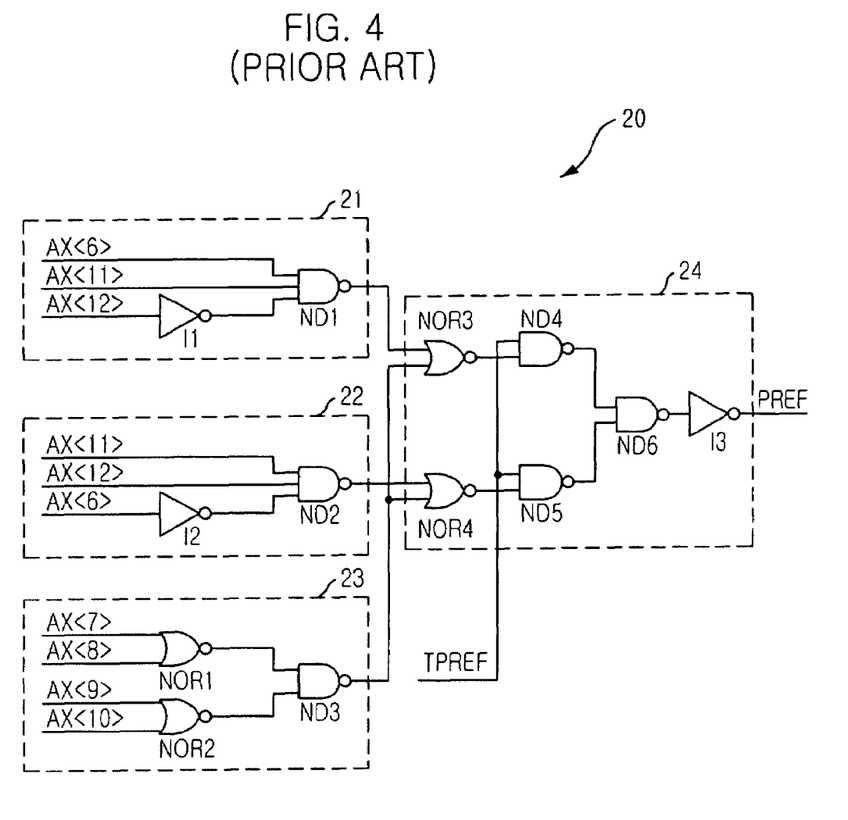
FIG. 4 is a circuit diagram describing a redundancy refresh control block shown in FIG. 1.

FIG. 4 is a circuit diagram describing the redundancy refresh control block 20 shown in FIG. 1.

As shown, the redundancy block refresh control block 20 includes address input units 21, 22 and 23, and a signal combining unit 24.

The address input units 21, 22 and 23 decode the half refresh address signal AX<6:12> inputted from the refresh address counter 10. The signal combining unit 24 combines the redundancy refresh signal TPREF inputted from the refresh control block 50 with decoding signals of the address input units 21, 22 and 23 to thereby generate a redundancy control signal PREF.

Continuously, referring to FIGS. 1 to 4, problems of the conventional semiconductor memory device are described as follows.

With technology advances, a memory capacity of the semiconductor memory device is increased and the semiconductor memory device is highly integrated to thereby increase a possibility of errors during a manufacturing process.

Hence, when the defects are found in the semiconductor memory device, the repair process is performed so that the preliminary cell in the redundancy block may perform a normal operation instead of the defective cell in the normal block. The memory cell block 40 of the semiconductor memory device includes the normal cell in the normal block and the preliminary cell in the redundancy block.

After the manufacturing process, an overall test is performed for finding out whether the semiconductor memory device operates well or not. At that time, because the unit cells of the semiconductor memory device for testing are in large numbers, it needs the refresh operation during testing.

The refresh control block 50 generates and outputs the refresh signal REFA and the refresh address counter 10 generates a full refresh address signal AX<0:12> in response to the refresh signal REFA.

The X-decoder 30 sequentially refreshes the normal block of the memory cell block 40 based on the full refresh address signal AX<0:12>.

For reference, the semiconductor memory device crosses a wordline and a bitline to thereby arrange the unit cell at every intersection. Because the refresh operation is performed by wordline, only the X-decoder 30 is used for the refresh operation.

As described above, it is necessary to perform the refresh operation to the preliminary cell in the redundancy block. The Redundancy X-decoder 60 sequentially refreshes the redundancy block of the memory cell block 40 according to the redundancy control signal PREF outputted from the redundancy refresh control block 20.

At this time, the redundancy block does not have an extra refresh time, but the refresh operation for the redundancy block is performed at every predetermined period according to the refresh time of the normal block. Namely, the refresh operation for the redundancy block is performed together with the refresh operation for the normal block at one time.

Herein, it is assumed that an 8K wordline is provided with the memory cell block 40 and a 2K wordline is provided with the redundancy block. The X-decoder 30 activates the 8K wordline according to the 13-bit full refresh address signal AX<0:12> of the refresh address counter 10. Also, the Redundancy X-decoder 60 activates the 2K wordline during a refresh operation of the 8K wordline refresh operation.

It is because the defect cell coupled to the 8K wordline is replaced with the preliminary cell coupled to the 2K wordline in an actual operation of the semiconductor memory device. So, only the refresh operation for the normal cells coupled to the 8K wordline is performed during data access.

Accordingly, during a testing, the X-decoder 30 sequentially activates the 8K wordline; and, at the same time, the Redundancy X-decoder 60 should properly activate the 2K wordline of the redundancy block.

In the mean time, the memory cell block 40 includes a plurality of normal blocks and redundancy blocks. The unit cells coupled to a wordline located at the redundancy blocks, which is replacing a wordline located at the normal blocks having defects, shares a bitline sense amplifier with the unit cells coupled to a corresponding wordline located at the normal blocks.

Because a power consumption and a circuit area increase due to an extra bitline sense amplifier, the redundancy blocks take the same form as that of the normal blocks to thereby remove a peripheral circuit like the bitline sense amplifier.

If the wordline of the normal blocks (hereinafter, referred to a normal wordline) and the preliminary wordline of the redundancy blocks (hereinafter, referred to a preliminary wordline) are close to each other, the refresh operations for cells coupled to the normal wordline and the preliminary wordline do not occur at the same time. In this situation, an additional control circuit for refreshing operation is required. The redundancy refresh control block 20 shown in FIG. 1 provides an exemplary for such an additional control circuit.

Referring to FIG. 4, the redundancy refresh control block 20 inputs the half refresh address signal AX<6:12> among the full refresh address signal AX<0:12>, outputted from the refresh address counter 10, to thereby control the timing of the refresh operation of preliminary wordline so as not to occur the refresh operations of the normal wordline and the preliminary wordline at the same time.

The address input units 21, 22 and 23 are classified into two groups: 'A' group includes the address input units 21 and 23; and 'B' group includes the address input units 22 and 23. The 'A' group is for detecting an address '1000010' and the 'B' group is for detecting an address '0000011'.

In case that the half refresh address signal AX<6:12> is '1000010' or '0000011', the redundancy refresh signal TPREF and decoding signals of the 'A' group and the 'B' group can generate the redundancy control signal PREF.

If the redundancy control signal PREF is activated, the Redundancy X-decoder 60 performs the refresh operation for the redundancy block.

For example, if the half refresh address signal AX<6:12> is '1000010', the redundancy blocks corresponding to residual blocks except for the normal blocks corresponding to the address '0100001' are refreshed.

As described above, the semiconductor memory device sequentially activates the normal wordline for refreshing cells coupled to the normal wordline. At the same time, in case that the preliminary wordline exists during the repair process, the corresponding preliminary wordline is also activated.

However, when the normal wordline and the preliminary wordline are close to each other, the refresh operation is controlled not to occur at the same time because the unit cells coupled to the normal wordline shares the circuit for a data access with the unit cells coupled to the preliminary wordline.

After the fabricating process, the test for finding out defects of the semiconductor memory device is performed. During a testing, the refresh operation is also required. Namely, during sequentially testing the normal wordline, all of the normal wordlines are refreshed. At the same time of activating the normal wordlines, the preliminary wordline is also activated.

However, in above described operation, in case that the normal wordline and the preliminary wordline except a wordline coupled to cells having the defects are refreshed at the same time, the power consumption is twice as much as before.

Accordingly, a noise can occur because a voltage level, which is supplied to the wordline, drops instantaneously or the power level alters suddenly. The noise is critical factor for amplifying data sensed from the unit cell; thus, it is impossible to exactly amplify the data inputted from the unit cell.

As the refresh operation is performed repeatedly with the noise, a risk of loss about the data stored in the unit cell dramatically increases. Hence, despite no defects, a probability about a failure of the refresh operation increases.

To avoid the above-mentioned problem, the normal wordline is only activated during an actual operation of the semiconductor memory device. In this case, it is impossible to guarantee whether the preliminary wordline is properly manufactured or not.

SUMMARY OF THE INVENTION

It is, therefore, an object of the present invention to provide a semiconductor memory device for consuming a uniform amount of current not only in a normal operation mode but also in a refresh operation mode.

In accordance with an aspect of the present invention, there is provided a semiconductor memory device, including: a memory cell block including a memory cell block including a N normal wordline and a M preliminary wordline; a refresh address counting block for outputting a refresh address, having a plurality of bits, corresponding to the N normal wordline and the M preliminary wordline; a refresh counting control block for resetting the refresh address counting block when the refresh address counts a predetermined count during a test mode; and a row decoding block for refreshing unit cells coupled to the N normal wordline and unit cells coupled to the M preliminary wordline of the memory cell block according to the refresh address and a redundancy control signal outputted from the refresh counting control block, wherein M, N are positive integers.

In accordance with another aspect of the present invention, there is provided a method for testing a semiconductor memory device including a N normal wordline and a M preliminary wordline, including the steps of: outputting L-bit refresh address by a refresh address counting block, corresponding to the N normal wordline and the M preliminary wordline; testing unit cells coupled to the N normal wordline according to the L-bit refresh address; testing unit cells coupled to the M preliminary wordline according to the L-bit refresh address after testing the unit cells coupled to the N normal wordline; refreshing the unit cells coupled to the N normal wordline, in sequence, according to the L-bit refresh address; and refreshing the unit cells coupled to the M preliminary wordline, in sequence, according to the L-bit refresh address after refreshing the unit cells coupled to the N normal wordline, wherein, when the L-bit refresh address counts up to a predetermined count, the refresh address counting block is reset and L, M and N are positive integer.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a semiconductor memory device according to the present invention will be described in detail with reference to the accompanying drawings.

Figure 5:
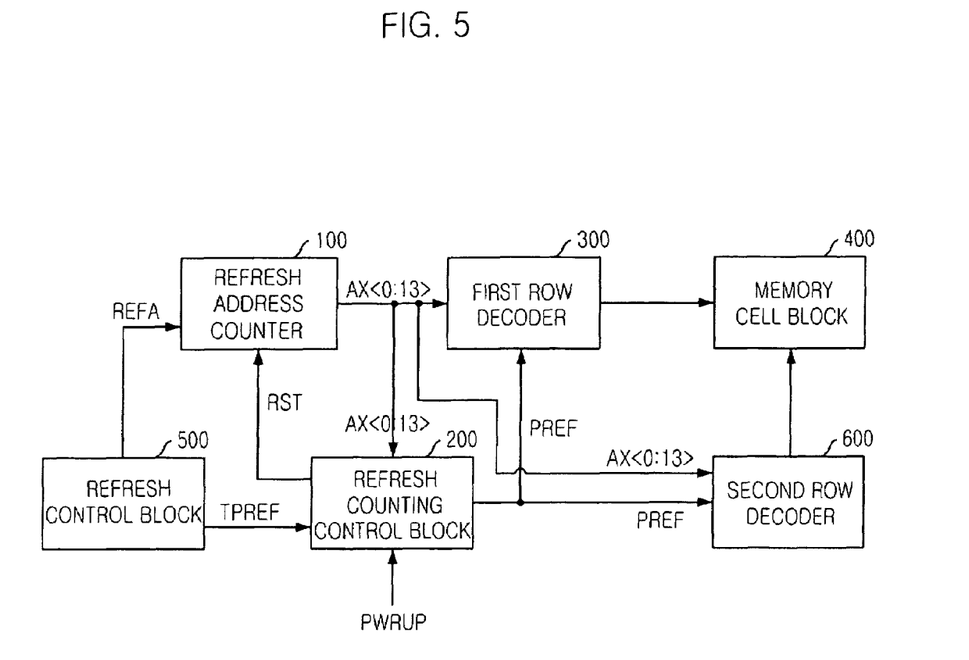
FIG. 5 is a block diagram showing a semiconductor memory device in accordance with an embodiment of the present invention.

FIG. 5 is a block diagram showing a semiconductor memory device in accordance with an embodiment of the present invention.

As shown, the semiconductor memory device according to the embodiment of the present invention includes an normal wordline coupled to plural unit cells (e.g., 8K), a refresh address counter 100, a refresh counting control block 200, a row decoding block including a first row decoder 300 and a second row decoder 600, a memory cell block 400 and a refresh control block 500.

The memory cell block 400 includes a preliminary wordline (e.g., 128) for a replacement of the normal wordline coupled to a unit cell having defects. The refresh address counter 100 sequentially outputs a refresh address AX<0:13>, corresponding to the 8K normal wordline and the 128 preliminary wordline. The refresh counting control block 200 resets the refresh address counter 100 when the refresh address AX<0:13> counts up to a value of adding 8K and 128 during testing. The refresh control block 500 controls the refresh address counter 100 and the refresh counting control block 200.

The row decoder includes a first row decoder 300 and a second row decoder 600. The first row decoder 300 sequentially activates the 8K normal wordline of the memory cell block 400 for refreshing unit cells coupled to the 8K normal wordline and the second row decoder 600 sequentially activates the 128 preliminary wordline of the memory cell block 400 according to the refresh address AX<0:13> and a redundancy control signal PREF outputted from the refresh counting control block 200.

If there are the 8K normal wordline, i.e., the number of normal wordlines is a value of multiplying 1024 by 8, the refresh address is 13 bits. The semiconductor memory device of the present invention activates sequentially the normal wordline and, continuously, activates sequentially the preliminary wordline during testing. Thus, the semiconductor memory device needs the refresh address having at least 13 bits. Accordingly, to control the value of adding 8K and 128 wordlines, the 14-bit refresh address AX<0:13> can be used.

Figure 6:
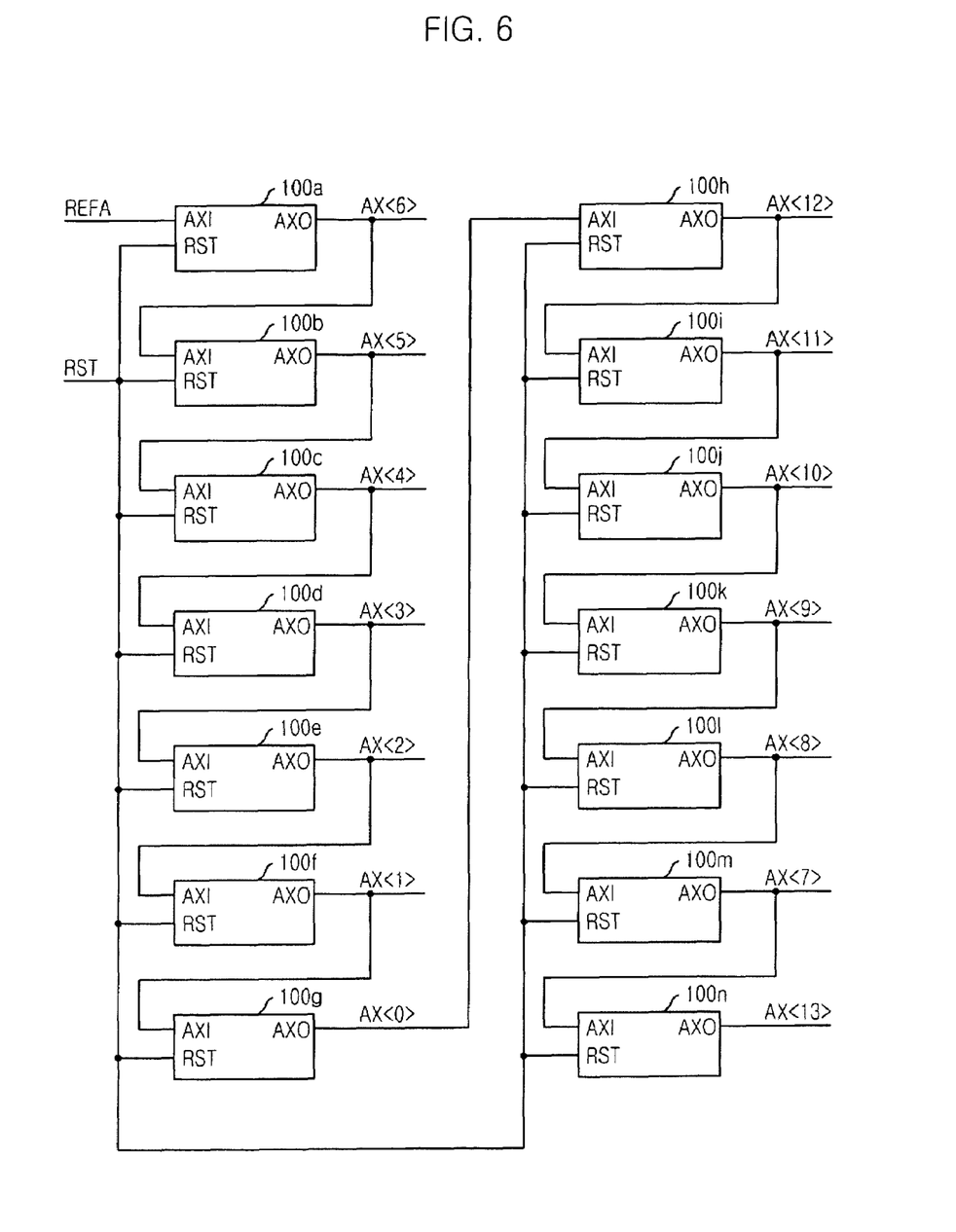
FIG. 6 is a block diagram showing a refresh address counter shown in FIG. 5.

FIG. 6 is a block diagram describing a refresh address counter shown in FIG. 5.

As shown, to output the 14-bit refresh address, the refresh address counter 100 includes 14 unit counters 100a to 100n, connected in series, each corresponding to each bit of the 14-bit refresh address A first unit counter 100a among the 14 unit counters 100a to 100n receives a refresh signal REFA from the refresh control block 500. Herein, the refresh signal REFA is for starting a count of the refresh address AX<0:13>. Also, the 14 unit counters 100a to 100n connected in series receives a reset signal RST, outputted from the refresh counting control block 200, to reset an internal operation in response to the reset signal RST.

Figure 7:
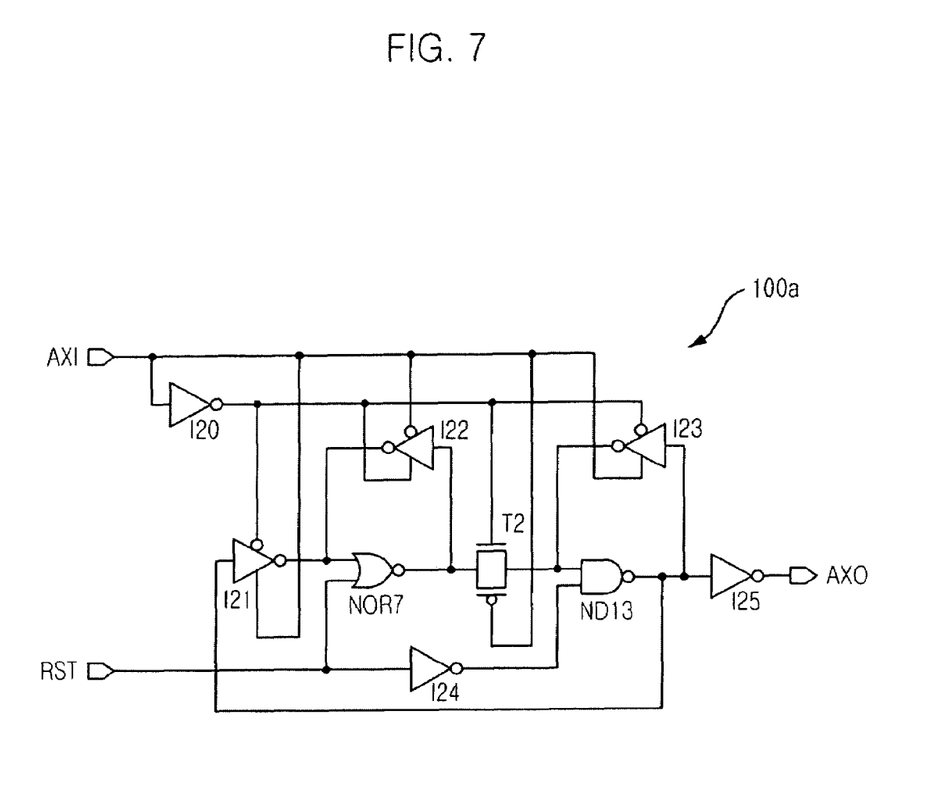
FIG. 7 is a circuit diagram describing a unit counter shown in FIG. 6.

FIG. 7 is a circuit diagram depicting a unit counter shown in FIG. 6.

As shown, the first unit count 100a includes a first inverter 121, a NOR gate NOR7, a transfer gate T2, a NAND gate ND13, a second inverter 125, a first three-state inverter 122 and a second three-state inverter 123.

The NOR gate NOR7 receives an output of the first inverter 121 and the reset signal RST to output a result of logic NOR operation. The transfer gate T2 selectively transfers an output of the NOR gate NOR7 in response to an input signal of an input node AXI. The NAND gate ND13 receives an output of the transfer gate T2 and an inverted reset signal RST to output a result of logic NAND operation. Also, an output node of the NAND gate ND 13 is connected to an input node of the first inverter 121. The second inverter 125 inverts an output of the NAND gate ND13 to output the inverse signal as an output signal of an output node AXO. The first three-state inverter 122 turns on based on the low level of the input signal to invert the output of the NOR gate NOR7. An output of the first three-state inverter 122 is connected to an input of the NOR gate NOR7. The second three-state inverter 123 turns on based on the high level of the input signal to invert the output of the NAND gate ND13. An output of the second three-state inverter 123 is connected to the input of the NAND gate ND 13.

Figure 8:
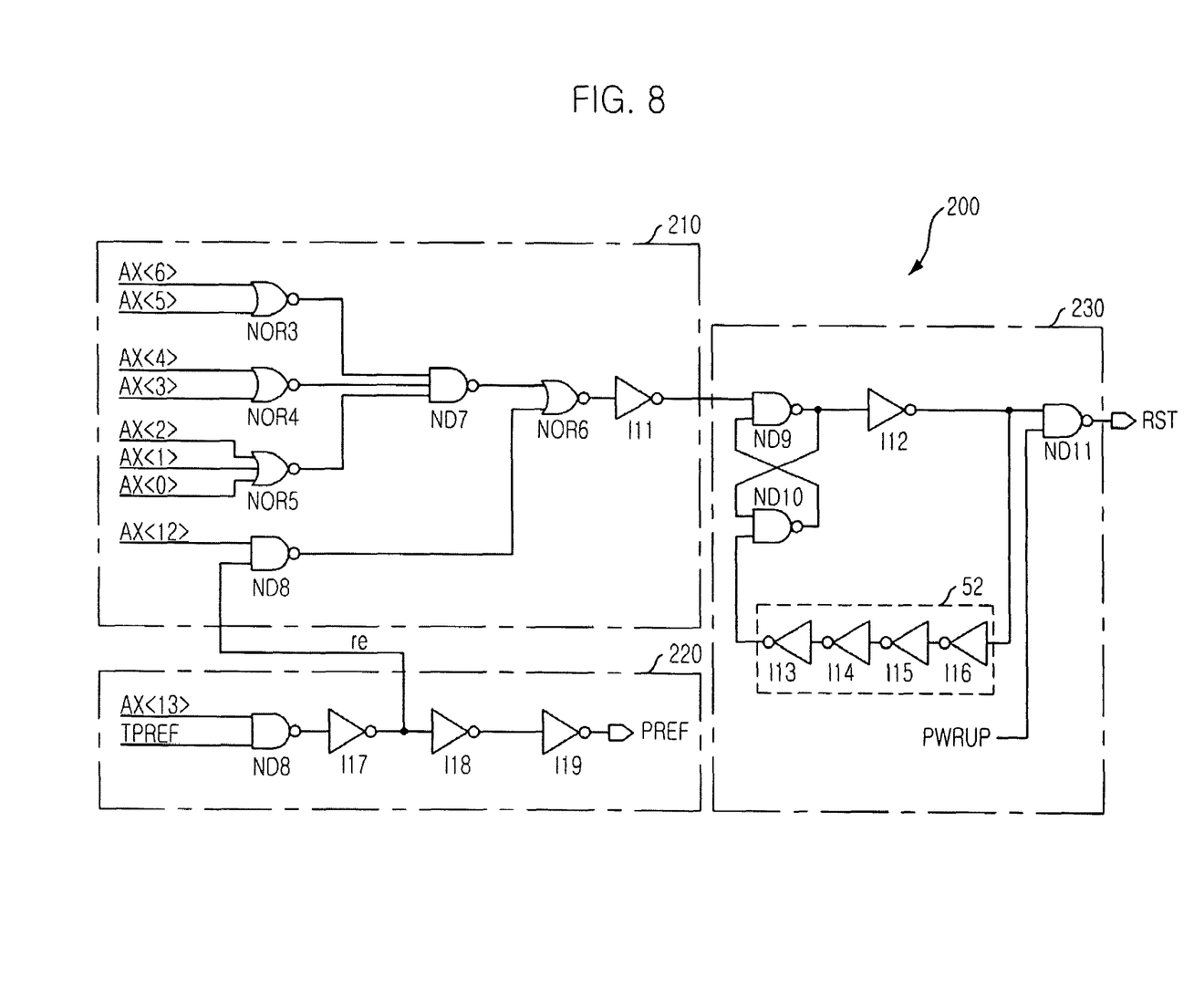
FIG. 8 is a circuit diagram depicting a refresh counting control unit shown in FIG. 5.

FIG. 8 is a circuit diagram describing the refresh counting control unit 200 shown in FIG. 5.

As shown, the refresh counting control block 200 includes a first reset signal generator 210, a second reset signal generator 230, and a redundancy refresh control block 220.

The first reset signal generator 210 decodes the refresh address to thereby output an address having a specific sequence address. The second reset signal generator 230 generates the reset signal RST for resetting the refresh address counter. The redundancy refresh control block 220 generates the redundancy control signal PREF, which is used to control refreshing a circuit associated with a redundancy block, based on a 14-th bit of refresh address AX<13> having more bits (e.g., one more bit) than required for the refresh address in refreshing the normal wordline. The redundancy control signal PREF is output to the row decoding block.

Hereinafter, referring to FIGS. 5 to 8, an operation of the semiconductor memory device in accordance with the embodiment of the present invention is as described in detail.

Generally, in order to find out defects of the semiconductor memory device after a fabrication process, a test for unit cells corresponding to every normal wordline and every preliminary wordline throughout data access is performed. After the test, a defective normal wordline coupled to a unit cell having the defects and a defective preliminary wordline coupled to a unit cell having the defects can be found. Then, a repair process for replacing the defective normal wordline with the preliminary wordline without any defects is performed.

As described above, after the test and the repair process, the semiconductor memory device can operate normally even the semiconductor memory device has defects.

The semiconductor memory device of the present invention includes a 8K normal wordline and a 128 preliminary wordline as a replacement of the normal wordline having a defect.

A procedure for testing the above wordlines is that the 8K normal wordline is sequentially tested and then the 128 preliminary wordline is sequentially tested. In the procedure, when the wordlines need to be activated, the 8K normal wordline is sequentially activated and then the 128 preliminary wordline is sequentially activated.

More particularly, first, the refresh control block 500 outputs the refresh signal REFA to the refresh address counter 100, the refresh address counter 100 outputs the 14-bit refresh address AX<0:13> by using the refresh signal REFA. Herein, the 14-bit refresh address AX<0:13> can count from 1 to 214, i.e., 16384.

The first row decoder 300 uses from a first count to a 8K-th, i.e., 8192-th, to refresh the 8K normal wordline. The second row decoder 600 uses from a 8193-th count to a 8320-th count, i.e., (8192+128) counts, to refresh the 128 preliminary wordline.

Up to the 8320-th count, the reset signal RST outputted from the refresh counting control block 200 is activated. As a result, the refresh address counter 100 can not continue the count beyond 832 in response to the reset signal RST.

In the present, it is possible to count the 16384 counts by using the 14-bit refresh address. However, only the refresh address corresponding to a number of a real wordline should be outputted. Therefore, the refresh counting control block 200 resets the refresh address counter 100 using the reset signal RST after the count reaches the actual size.

In the prior art, when the semiconductor memory device operates, the semiconductor memory device refreshes unit cells coupled to only 8K wordline. Namely, there is no extra time for refreshing unit cells coupled to the preliminary wordline, but the refresh operation for the unit cells coupled to the preliminary wordline is performed together with the refresh operation for the unit cells coupled to the normal wordline. So, it is possible to activate the wordlines for the refresh operation by only 13-bit refresh address.

On the other hand, in the present invention, the normal wordline is sequentially activated and then the 128 preliminary wordline is sequentially activated. So, the 14-bit refresh address is used for counting an exact number of the wordline. Herein, the 14-bit refresh address can count the 16384-th. In the present invention, to prevent counting up to the 16384-th, the reset signal RST is used. Namely, if there is no reset signal RST, the semiconductor memory device starts to perform the refresh operation at an arbitrary wordline. In this case, it is occurred that the unit cells coupled to some wordlines among the 8K wordline are not refreshed. The above problem is the reason why the reset signal RST is used.

The first reset signal generator 210 and the second reset signal generator 230 of the refresh counting control block 200 generates the reset signal RST. The first reset signal generator 210 decodes the refresh address inputted from the refresh address counter 100 to thereby find out the 8320-th refresh address. The second reset signal generator 230 generates the reset signal RST according to the 8320-th refresh address.

At this time, the second reset signal generator 230 uses a power-up signal PWRUP. The power-up signal PWRUP is for outputting the reset signal RST after a power source for supplying a power to the semiconductor memory device supplied with the semiconductor memory device is stable.

The redundancy refresh control block 220 generates the redundancy control signal PREF using the redundancy refresh signal TPREF and the 14-th refresh address AX<13>. Herein, the redundancy refresh signal TPREF controls the refresh operation of the redundancy block and the 14-th refresh address AX<13> has the higher weight than other bits of the refresh address to control the normal wordline. Also, the redundancy control signal PREF refreshes the circuit related with the redundancy block.

Accordingly, the first row decoder 300 sequentially refreshes the unit cells coupled to the 8K normal wordline of the memory cell block 400 and the second row decoder 600 sequentially refreshes the unit cells coupled to the 128 preliminary wordline of the memory cell block 400 according to the redundancy control signal PREF and the refresh address AX<0:13>.

As described above, in the prior art, the semiconductor memory device refreshes the unit cells coupled to the normal wordline, at the same time, refreshes the unit cells coupled to the preliminary wordline with a predetermined period. On the other hand, in the present invention, the normal wordline is sequentially activated and then the preliminary wordline is sequentially activated by adding one bit refresh address.

Accordingly, when the refresh operation needs during test, only one kind of wordline among the normal wordline and the preliminary wordline is activated. For this reason, a current consumption of an internal power supply in the semiconductor memory device, especially a circuit for supplying a high voltage in order to activate the wordlines, can be uniform. A power noise of the high voltage supply can be dramatically reduced.

Also, the semiconductor memory device of the present invention can consume a uniform amount of current not only in a normal operation mode but also in a refresh operation mode.

The present application contains subject matter related to Korean patent application No. 2005-58717, filed in the Korean Intellectual Property Office on Jun. 30, 2005, the entire contents of which is incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
a memory cell block including N normal wordline and M preliminary wordline;
a refresh address counting block for outputting a refresh address, having a plurality of bits, corresponding to the N normal wordline and the M preliminary wordline;
a refresh counting control block for resetting the refresh address counting block when the refresh address counts a predetermined count; and
a row decoding block for refreshing unit cells coupled to the N normal wordline and unit cells coupled to the M preliminary wordline according to the refresh address and a redundancy control signal outputted from the refresh counting control block,
wherein M, N are positive integers.

2. The device as recited in claim 1, wherein the predetermined count equals the sum of M and N.

3. The device as recited in claim 2, wherein the M preliminary wordline is used to replace a normal wordline having defects.

4. The device as recited in claim 2, wherein the refresh address counting block outputs the refresh address in sequence.

5. The device as recited in claim 2, wherein the refresh address includes the number of bits having a positive integer larger than log2N.

6. The device as recited in claim 2, further comprising:
a refresh control block for controlling the refresh address counting block and the refresh counting control block.

7. The device as recited in claim 4, wherein the row decoding block refreshes the unit-cells in sequence.

8. The device as recited in claim 5, wherein the refresh counting control block includes:
a reset signal generating block for generating a reset signal to reset the refresh address counting block; and
a redundancy refresh control block for generating the redundancy control signal to refresh a circuit associated with a redundancy block using the refresh address having a weight larger than log2N to thereby output the redundancy control signal to the row decoding block.

9. The device as recited in claim 5, wherein the row decoding block includes:
a first row decoding block for refreshing the unit cells coupled to the N normal wordline of the memory cell block, in sequence, according to the refresh address; and
a second row decoding block for refreshing the unit cells coupled to the M preliminary wordline of the memory cell block, in sequence, according to the refresh address.

10. The device as recited in claim 8, wherein the reset signal generating block includes:
a first reset signal generating block for decoding the refresh address to thereby output an address having a specific sequence address; and
a second reset signal generator for generating the reset signal for resetting the refresh address counting block.

11. The device as recited in claim 8, wherein the refresh address counting block includes a plurality of unit counters connected in series, corresponding to the number of bits having a positive integer larger than log2N.

12. The device as recited in claim 10, wherein the specific sequence address is (M+N)th address.

13. The device as recited in claim 11, wherein each of the unit counters includes:
a first inverter;
a NOR gate for receiving an output of the first inverter and the reset signal to output a result of logic NOR operation;
a transfer gate for transferring an output of the NOR gate in response to a first level of an input signal inputted to an input node;
a NAND gate including input nodes for receiving an output of the transfer gate and an inverted reset signal, and an output node connected to an input node of the first inverter;
a second inverter for inverting an output of the NAND gate to thereby output an output signal to an output node;
a first three-state inverter for inverting the output of the NOR gate according to the first level of the input signal to thereby transfer an inverted output signal to the one input node of the NOR gate; and
a second three-state inverter for inverting the output of the NAND gate according to a second level of the input signal to thereby transfer an inverted output signal to the one input node of the NAND gate.

14. The device as recited in claim 13, wherein the first level of the input signal is a 'LOW' level and the second level of the input signal is a 'HIGH' level.

15. The device as recited in claim 6, wherein the refresh control block generates a refresh signal inputted to the refresh address counter and a redundancy refresh signal inputted to the refresh counting control block.

16. A method for a semiconductor memory device including a N normal wordline and a M preliminary wordline, comprising the steps of:
outputting L-bit refresh address by a refresh address counting block, corresponding to the N normal wordline and the M preliminary wordline;
a first group of unit cells coupled to the N normal wordline according to the L-bit refresh address;

a second group of unit cells coupled to the M preliminary wordline according to the L-bit refresh address;
refreshing the first group of unit cells in sequence, according to the L-bit refresh address; and
refreshing the second group of unit cells in sequence, according to the L-bit refresh address,
wherein, said refreshing the first group and said refreshing the second group are performed sequentially, and when the L-bit refresh address counts up to a predetermined count, the refresh address counting block is reset and L, M and N are positive integer.

17. The method as recited in claim 16, wherein the first group of unit cells is tested in sequence.

18. The method as recited in claim 17, wherein the second group of unit cells is tested in sequence.

19. The method as recited in claim 18, wherein the predetermined count equals the sum of M and N.

20. The method as recited in claim 19, wherein the L-bit includes a positive integer larger than log2N.

* * * * *